United States Patent
Suzuki et al.

(10) Patent No.: US 9,349,800 B2
(45) Date of Patent: May 24, 2016

(54) SEMICONDUCTOR DEVICE

(71) Applicant: Kabushiki Kaisha Toshiba, Minato-ku (JP)

(72) Inventors: Mariko Suzuki, Kanagawa (JP); Tadashi Sakai, Kanagawa (JP); Naoshi Sakuma, Kanagawa (JP); Masayuki Katagiri, Kanagawa (JP); Yuichi Yamazaki, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/825,235

(22) Filed: Aug. 13, 2015

(65) Prior Publication Data

US 2015/0349060 A1    Dec. 3, 2015

Related U.S. Application Data

(62) Division of application No. 14/090,064, filed on Nov. 26, 2013, now Pat. No. 9,142,618.

(30) Foreign Application Priority Data

Nov. 28, 2012   (JP) ................................. 2012-260233

(51) Int. Cl.
*H01L 31/0312*   (2006.01)
*H01L 29/16*    (2006.01)
(Continued)

(52) U.S. Cl.
CPC ...... *H01L 29/1602* (2013.01); *H01L 21/02376* (2013.01); *H01L 21/02433* (2013.01); *H01L 21/02444* (2013.01); *H01L 21/02494* (2013.01);
(Continued)

(58) Field of Classification Search
CPC . H01L 21/041; H01L 29/045; H01L 29/8128; H01L 29/868; H01L 29/872; H01L 29/6603; H01L 29/66045; H01L 21/02376; H01L 21/02433; H01L 21/02444; H01L 21/02494; H01L 21/02502; H01L 21/02516; H01L 21/02527; H01L 21/02576
USPC ........... 257/77, 139, 267, 279–280, 339, 409, 257/653–654, 471
See application file for complete search history.

(56) References Cited

U.S. PATENT DOCUMENTS 8,610,235 B2    12/2013  Calafut et al.
2012/0025874 A1   2/2012  Saikaku et al.
(Continued)

FOREIGN PATENT DOCUMENTS

JP    WO2010/001705    1/2010

*Primary Examiner* — Dung Le
(74) *Attorney, Agent, or Firm* — Oblon, McClelland, Maier & Neustadt, L.L.P.

(57) ABSTRACT

A semiconductor device according to an embodiment includes: a first diamond semiconductor layer of a first conductivity type including a main surface having a first plane orientation; a trench structure formed in the first diamond semiconductor layer; a second diamond semiconductor layer formed on the first diamond semiconductor layer in the trench structure and having a lower dopant concentration than the first diamond semiconductor layer; a third diamond semiconductor layer of a second conductivity type formed on the second diamond semiconductor layer and having a higher dopant concentration than the second diamond semiconductor layer; a first electrode electrically connected to the first diamond semiconductor layer; and a second electrode electrically connected to the third diamond semiconductor layer.

5 Claims, 8 Drawing Sheets

(51) Int. Cl.
    *H01L 29/04*     (2006.01)
    *H01L 29/78*     (2006.01)
    *H01L 29/10*     (2006.01)
    *H01L 29/36*     (2006.01)
    *H01L 21/04*     (2006.01)
    *H01L 29/812*    (2006.01)
    *H01L 29/868*    (2006.01)
    *H01L 29/872*    (2006.01)
    *H01L 29/66*     (2006.01)
    *H01L 21/02*     (2006.01)
    *H01L 29/423*    (2006.01)
    *H01L 29/06*     (2006.01)

(52) U.S. Cl.
    CPC .... *H01L 21/02502* (2013.01); *H01L 21/02516* (2013.01); *H01L 21/02527* (2013.01); *H01L 21/02576* (2013.01); *H01L 21/02579* (2013.01); *H01L 21/041* (2013.01); *H01L 21/042* (2013.01); *H01L 29/045* (2013.01); *H01L 29/1037* (2013.01); *H01L 29/36* (2013.01); *H01L 29/6603* (2013.01); *H01L 29/66045* (2013.01); *H01L 29/78* (2013.01); *H01L 29/8128* (2013.01); *H01L 29/868* (2013.01); *H01L 29/872* (2013.01); *H01L 29/0657* (2013.01); *H01L 29/4236* (2013.01)

(56) References Cited

U.S. PATENT DOCUMENTS

2012/0187475 A1* 7/2012 Yamazaki ............... H01L 21/84
                                                          257/330
2013/0075757 A1  3/2013 Suzuki et al.

* cited by examiner

SEMICONDUCTOR DEVICE

CROSS-REFERENCE TO RELATED APPLICATION

This application is a division of and claims the benefit of priority under 35 U.S.C. §120 from U.S. Ser. No. 14/090,064 filed Nov. 26, 2013, and claims the benefit of priority under 35 U.S.C. §119 from Japanese Patent Application No. 2012-260233 filed Nov. 28, 2012, the entire contents of each of which are incorporated herein by reference.

FIELD

Embodiments described herein relate generally to semiconductor devices.

BACKGROUND

Diamond is attracting attention as a material for a semiconductor device because it has excellent semiconductor characteristics in addition to its mechanical, chemical and thermal characteristics. In particular, since diamond has a band gap of about 5.5 eV at room temperature, it is expected to be used as a material for an ultraviolet emission device and an electron emission device using negative electron affinity. Also, since diamond has high breakdown voltage, it is expected to be used as a material for a power device. In addition, since diamond has solid crystallinity, it is expected to be used as a material for an environment-resistant device that is used particularly in severe environments such as high temperature or radiation.

Recently, a diamond power device is actively developed, and a report is made on a Schottky barrier diode having a Schottky junction, a device having a PIN structure, and a device having a combination of a Schottky junction and a PN junction, and the like.

Also, it is known that the dopant incorporation efficiency in the formation of a diamond semiconductor layer depends strongly on the plane orientation of an underlayer.

DETAILED DESCRIPTION

A semiconductor device according to an embodiment includes: a first diamond semiconductor layer of a first conductivity type including a principal surface having a first plane orientation; a trench structure formed in the first diamond semiconductor layer; a second diamond semiconductor layer formed on the first diamond semiconductor layer in the trench structure and having a lower dopant concentration than the first diamond semiconductor layer; a third diamond semiconductor layer of a second conductivity type formed on the second diamond semiconductor layer and having a higher dopant concentration than the second diamond semiconductor layer; a first electrode electrically connected to the first diamond semiconductor layer; and a second electrode electrically connected to the third diamond semiconductor layer.

In a diamond semiconductor, since it is difficult to perform doping by ion implantation and solid-phase diffusion, doping is generally performed in the deposition of a semiconductor layer.

Then, in the deposition of a diamond semiconductor, dopant incorporation efficiency depends significantly on a plane orientation. For this reason, in the formation of a diamond semiconductor layer, the degree of auto-doping by a dopant contained in an underlayer depends significantly on a plane orientation.

In an embodiment, by using a trench structure to form a semiconductor device using a diamond semiconductor material, different semiconductor layers can be formed in different plane orientations. Accordingly, the concentration of a dopant incorporated into a diamond semiconductor is controlled. Thus, the dopant concentration in a diamond semiconductor layer can be controlled to a desired value with high accuracy. In particular, the controllability of the dopant concentration of an intrinsic or lightly-doped layer having a great influence on the characteristics of a semiconductor device is improved, and a stable, low-on-resistance and high-breakdown-voltage semiconductor device is realized.

Hereinafter, embodiments will be described with reference to the drawings.

First Embodiment

A semiconductor device according to the first embodiment includes: a first diamond semiconductor layer of a first conductivity type including a principal surface having a first plane orientation; a trench structure formed in the first diamond semiconductor layer; a second diamond semiconductor layer formed on the first diamond semiconductor layer in the trench structure and having a lower dopant concentration than the first diamond semiconductor layer; a third diamond semiconductor layer of a second conductivity type formed on the second diamond semiconductor layer and having a higher dopant concentration than the second diamond semiconductor layer; a first electrode electrically connected to the first diamond semiconductor layer; and a second electrode electrically connected to the third diamond semiconductor layer.

Since the semiconductor device according to the first embodiment has the above configuration, in particular, the dopant of an intrinsic semiconductor layer or the second diamond semiconductor layer having a low dopant concentration is controlled with high accuracy. Therefore, a stable, low-on-resistance and high-breakdown-voltage semiconductor device can be realized.

Figure 1:
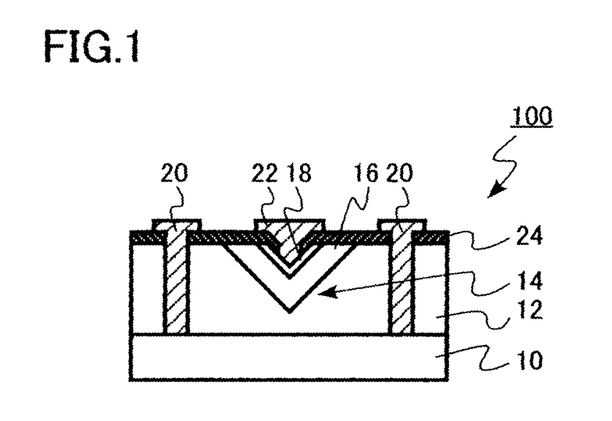
FIG. 1 is a schematic cross-sectional view of a semiconductor device according to the first embodiment.

FIG. 1 is a schematic cross-sectional view of a semiconductor device according to the first embodiment. A semiconductor device 100 according to the first embodiment is a trench PIN diode.

The semiconductor device 100 is formed, for example, on a single crystal diamond substrate 10 including a principal surface having a first plane orientation. The first plane orientation has a slope of, for example, 45° or less in a <011> direction from a {111} plane. Herein, the principal surface is the widest surface of the substrate 10. When the substrate 10 is a wafer, the principal surface is the front surface and the rear surface of the wafer.

An n-type first diamond semiconductor layer 12 including a principal surface having a first plane orientation is formed on the substrate 10. The first plane orientation has an off angle of, for example, 0° to 10° from the {111} plane.

The first diamond semiconductor layer 12 has a dopant concentration of, for example, $1 \times 10^{18}$ atoms/cm$^3$ to $1 \times 10^{21}$ atoms/cm$^3$. The n-type dopant is, for example, phosphorus (P).

Then, a trench structure 14 is formed in the first diamond semiconductor layer 12. The trench structure 14 has, for example, a V-shaped section. Then, the trench structure 14 is provided in such a manner that a second plane orientation (for example, {100} plane or {110} plane) different from the first plane orientation is formed on the inner surface of the trench.

Then, a second diamond semiconductor layer 16 is formed on the first diamond semiconductor layer 12 in the trench structure 14. The second diamond semiconductor layer 16 is a so-called drift layer.

The second diamond semiconductor layer 16 has a lower dopant concentration than the first diamond semiconductor layer 12. The second diamond semiconductor layer 16 is, for example, an n-type, a p-type, or an intrinsic (i) type. From the viewpoint of the realization of a high breakdown voltage and a high mobility, it may be preferable that the second diamond semiconductor layer 16 has a dopant concentration of $1 \times 10^{15}$ atoms/cm$^3$ or less.

Then, a p-type third diamond semiconductor layer 18 is formed on the second diamond semiconductor layer 16. The third diamond semiconductor layer 18 has a higher dopant concentration than the second diamond semiconductor layer 16.

The third diamond semiconductor layer 18 has a dopant concentration of, for example, $1 \times 10^{18}$ atoms/cm$^3$ to $1 \times 10^{21}$ atoms/cm$^3$. The p-type dopant is, for example, boron (B).

In addition, a first electrode 20 is electrically connected to the first diamond semiconductor layer 12. The first electrode 20 is a cathode (negative electrode).

The first electrode 20 is formed in a trench provided in the first diamond semiconductor layer 12. This structure increases a contact area with the first diamond semiconductor layer 12 and reduces a contact resistance.

The first electrode 20 is formed of a metal. The metal is, for example, titanium (Ti). It may be preferable that the contact between the first electrode 20 and the first diamond semiconductor layer 12 is an ohmic contact.

Also, a second electrode 22 is electrically connected to the third diamond semiconductor layer 18. The second electrode 22 is an anode (positive electrode).

The second electrode 22 is formed of a metal. The metal is, for example, titanium (Ti). It may be preferable that the contact between the second electrode 22 and the third diamond semiconductor layer 18 is an ohmic contact.

An insulating film 24 is formed on the surfaces of the first diamond semiconductor layer 12, the second diamond semiconductor layer 16, and the third diamond semiconductor layer 18. Portions of the first electrode 20 and the second electrode 22 are formed on the insulating film 24.

In the first embodiment, the second diamond semiconductor layer 16 acting as a drift layer is formed on the n-type first diamond semiconductor layer 12 having a plane orientation at or near the {111} plane. In this case, the second diamond semiconductor layer 16 is formed in the trench structure 14 formed in the first diamond semiconductor layer 12. The trench structure 14 is provided in such a manner that a second plane having a different plane orientation from the {111} plane (for example, the {100} plane or the {110} plane) is formed on the inner surface of the trench.

In a diamond semiconductor layer formed by CVD (Chemical Vapor Deposition) growth, the dopant incorporation efficiency into the layer depends strongly on a plane orientation. For example, when the dopant is phosphorus (P) that is an n-type dopant, the phosphorus incorporation efficiency is about 0.02% in the case of {111} plane growth on the {111} plane substrate (that is, growth in the <111> direction).

On the other hand, the phosphorus incorporation efficiency is about 0.0002% in the case of {110} plane growth on the {110} plane substrate (that is, growth in the <110> direction). Also, the phosphorus incorporation efficiency is less than 0.00001% in the case of {100} plane growth on the {100} plane substrate (that is, growth in the <100> direction).

Then, as in the phosphorus (P), the boron (B) incorporation efficiency increases in the case of {111} plane growth on the {111} plane substrate in the <111> direction.

For this reason, when a high concentration of dopant is contained in an underlayer in the formation of a diamond semiconductor layer, stable control of the dopant concentration is difficult because dopant incorporation from the underlayer (so-called auto-doping) occurs. In particular, this problem is significant in the formation of an intrinsic or lightly-doped diamond semiconductor layer.

According to the configuration of the semiconductor device 100 of the first embodiment, by having the plane orientation near the {111} plane, the first diamond semiconductor layer 12 can easily contain an n-type dopant of phosphorus at a high concentration. The first diamond semiconductor layer 12 acts as a contact layer with the first electrode 20, and requires a high dopant concentration in order to reduce a contact resistance and an on resistance.

On the other hand, the second diamond semiconductor layer 16 acting as a drift layer requires a low dopant concentration in order to provide a thin film with a high breakdown voltage. According to the configuration of the semiconductor device 100 of the first embodiment, by providing the trench structure in the first diamond semiconductor layer 12 having a high dopant concentration and an underlying layer having a different plane orientation from the {111} plane, such as the {100} plane and the {110} plane, the second diamond semiconductor layer 16 can be grown.

Thus, the dopant incorporation from the first diamond semiconductor layer 12 can be suppressed, and the dopant concentration can be stably controlled to a low concentration. Accordingly, a PIN diode having a low on resistance of, for example, 0.1 mΩcm$^2$ or less and a high breakdown voltage of, for example, 1 kV or more can be stably manufactured with high reproducibility.

Also, by suppressing the dopant incorporation, the degradation of the steepness of a junction interface and the occurrence of a defect can be suppressed. Accordingly, the degradation of carrier mobility and the increase of a reverse leakage current can be suppressed.

Also, from the viewpoint of the increase of the dopant incorporation efficiency into the first diamond semiconductor layer 12, it may be preferable that the first plane orientation has a slope of 45° or less in the <011> direction from the {111} plane, it may be more preferable that the first plane orientation has a slope of 30° or less in the <011> direction from the {111} plane, and it may be further preferable that the first plane orientation has a slope of 15° or less in the <011> direction from the {111} plane.

Also, from the viewpoint of the suppression of the dopant incorporation into the second diamond semiconductor layer 16, it may be preferable that the plane orientation of the interface between the first diamond semiconductor layer 12 and the second diamond semiconductor layer 16 is within ±10° from the {100} plane or the {110} plane, and it may be more preferable that the plane orientation of the interface between the first diamond semiconductor layer 12 and the second diamond semiconductor layer 16 is within ±5° from the {100} plane or the {110} plane.

Also, while the trench structure 14 has been described as having a V shape as an example, the trench structure 14 is not limited to a V shape as long as it has the second plane orientation other than the first plane orientation on the inner surface. For example, the trench structure 14 may have a U shape, a rectangular shape, or the like. Also, the second diamond semiconductor layer 16 may be formed in a partial region of the inner surface of the trench structure 14, although it is not formed in all region of the inner surface of the trench structure 14.

Next, a method for manufacturing a semiconductor device according to the first embodiment will be described. The method for manufacturing a semiconductor device according to the first embodiment includes: preparing a substrate including a principal surface having a first plane orientation; forming a first diamond semiconductor layer of a first conductivity type including a principal surface having the first plane orientation on the substrate; forming a trench structure in the first diamond semiconductor layer; forming a second diamond semiconductor layer having a lower dopant concentration than the first diamond semiconductor layer on the first diamond semiconductor layer in the trench structure; forming a third diamond semiconductor layer of a second conductivity type having a higher dopant concentration than the second diamond semiconductor layer on the second diamond semiconductor layer; forming a first electrode electrically connected to the first diamond semiconductor layer; and forming a second electrode electrically connected to the third diamond semiconductor layer.

FIGS. 2A to 2G are schematic cross-sectional views illustrating a method for manufacturing a semiconductor device according to the first embodiment.

Figure 2A:
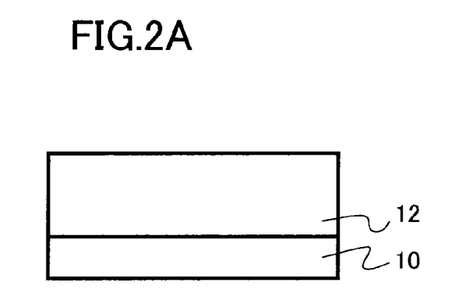
FIGS. 2A to 2G are schematic cross-sectional views illustrating a method for manufacturing a semiconductor device according to the first embodiment.

First, a substrate 10 including a principal surface having a first plane orientation is prepared. The substrate 10 is, for example, an undoped diamond semiconductor. The first plane orientation is, for example, {111}.

Then, an n-type first diamond semiconductor layer 12 including a principal surface having the {111} plane orientation is formed on the substrate 10 (FIG. 2A). Dopants of phosphorus (P) are included in the first diamond semiconductor layer 12. The first diamond semiconductor layer 12 has a dopant concentration of, for example, $1 \times 10^{18}$ atoms/cm$^3$ to $1 \times 10^{21}$ atoms/cm$^3$. The first diamond semiconductor layer 12 is formed, for example, by microwave plasma CVD.

Also, from the viewpoint of the incorporation of the dopant in the first diamond semiconductor layer 12 at a high concentration, it may be preferable that the first plane orientation has a slope of 45° or less in the <011> direction from the {111} plane.

Figure 2B:
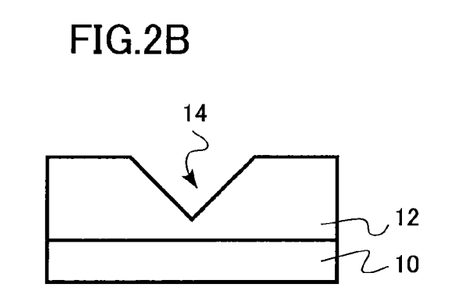

Next, a trench structure 14 is formed in the first diamond semiconductor layer 12, for example, by lithography and RIE (Reactive Ion Etching) (FIG. 2B). The trench structure 14 has, for example, a V shape. The inner surface of the V-shaped trench structure 14 has a second plane orientation different from the first plane orientation. The second plane orientation is, for example, {110}.

Next, a second diamond semiconductor layer 16 having a lower dopant concentration than the first diamond semiconductor layer 12 is formed on the first diamond semiconductor layer 12 in the trench structure 14. The second diamond semiconductor layer 16 is, for example, an undoped diamond semiconductor layer into which a dopant is not actively incorporated. The second diamond semiconductor layer 16 having the second plane orientation (for example, the {110} plane orientation) exposed to the inner surface is formed in the trench structure 14. That is, the second diamond semiconductor layer 16 grows in the <110> direction. The second diamond semiconductor layer 16 is formed, for example, by microwave plasma CVD.

Phosphorus (P) incorporation efficiency is smaller in the case of growth in the {110} plane orientation in the <110> direction, than in the case of growth in the {111} plane orientation in the <111> direction. Therefore, in the formation of the second diamond semiconductor layer 16, autodoping of phosphorus from the first diamond semiconductor layer 12 containing a high concentration of underlying phosphorus is suppressed. Therefore, the second diamond semiconductor layer 16 that is very similar to an intrinsic semiconductor can be formed.

Also, while the case that the second plane orientation is {110} has been described as an example herein, the second plane orientation is not limited thereto as long as it is different from the first plane orientation. From the viewpoint of the suppression of the auto-doping of a dopant into the second diamond semiconductor layer 16, it may be preferable that the second plane orientation is within ±10° from the {100} plane or the {110} plane.

Figure 2C:
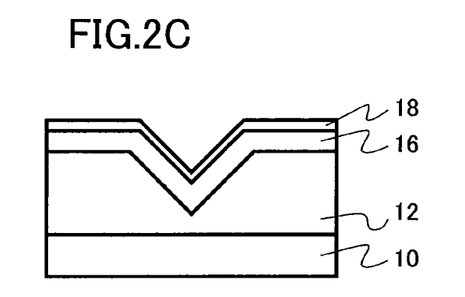

Next, a p-type third diamond semiconductor layer 18 having a higher dopant concentration than the second diamond semiconductor layer 16 is formed on the second diamond semiconductor layer 16 (FIG. 2C). A dopant of boron (B) is included in the third diamond semiconductor layer 18. The third diamond semiconductor layer 18 has a dopant concentration of, for example, $1 \times 10^{18}$ atoms/cm$^3$ to $1 \times 10^{21}$ atoms/cm$^3$. The third diamond semiconductor layer 18 is formed, for example, by microwave plasma CVD.

Next, a passivation film (not illustrated) is formed in a region including a slope in the trench structure 14 on the third diamond semiconductor layer 18. The passivation film is, for example, a silicon oxide film.

Figure 2D:
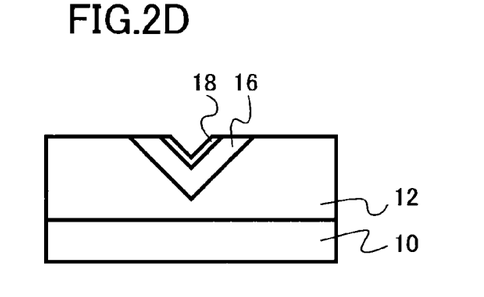

Thereafter, for example, by oxygen-based RIE, the second diamond semiconductor layer 16 and the third diamond semiconductor layer 18 are etched until the first diamond semiconductor layer 12 is exposed to the surface. Thereafter, the passivation film is removed by wet etching or the like (FIG. 2D).

Figure 2E:
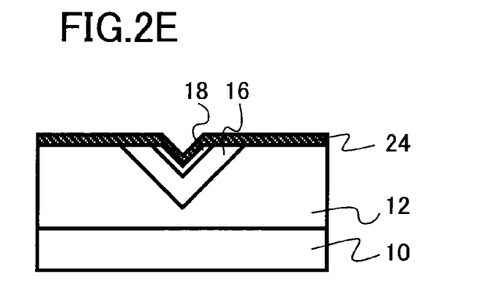

Next, an insulating film 24 is formed in a region including a slope in the trench structure 14 on the third diamond semiconductor layer 18 (FIG. 2E). The insulating film 24 is, for example, a silicon nitride film.

Figure 2F:
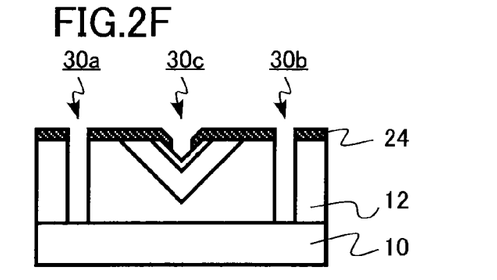

Next, openings 30a and 30b are formed in the insulating film 24, for example, by lithography and RIE. Then, for example, a trench reaching the substrate 10 is formed in the openings 30a and 30b, for example, by RIE. Also, an opening 30c is formed in the insulating film 24, for example, by lithography and RIE (FIG. 2F).

Figure 2G:
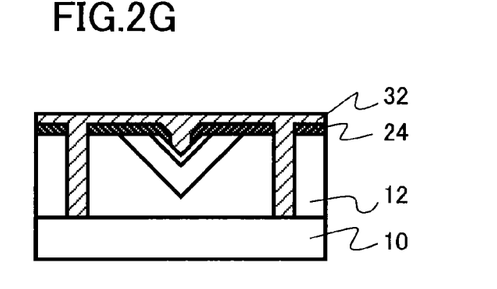

Thereafter, a metal film 32, for example, a titanium (Ti) film is formed by sputtering (FIG. 2G).

Thereafter, for example, by lithography and RIE, the metal film 32 is patterned to form a first electrode 20 and a second electrode 22. By the above manufacturing method, the semiconductor device 100 illustrated in FIG. 1 is formed.

Second Embodiment

A semiconductor device according to the second embodiment includes: a first diamond semiconductor layer of a first conductivity type including a principal surface having a first plane orientation; a trench structure formed in the first diamond semiconductor layer; a second diamond semiconductor layer formed on the first diamond semiconductor layer in the trench structure and having a lower dopant concentration than the first diamond semiconductor layer; a first electrode electrically connected to the first diamond semiconductor layer; and a second electrode electrically connected to the second diamond semiconductor layer.

The semiconductor device of the second embodiment is different from the semiconductor device of the first embodiment in that the semiconductor device of the second embodiment is a Schottky diode that does not include a third diamond semiconductor layer. A description of an overlap with the first embodiment will be omitted.

Figure 3:
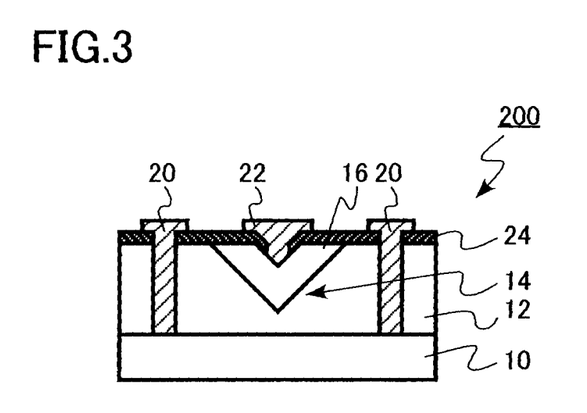
FIG. 3 is a schematic cross-sectional view of a semiconductor device according to the second embodiment.

FIG. 3 is a schematic cross-sectional view of a semiconductor device according to the second embodiment. A semiconductor device 200 according to the second embodiment is a trench type Schottky diode.

The semiconductor device 200 is formed, for example, on a single crystal diamond substrate 10 including a principal surface having a first plane orientation. The first plane orientation has a slope of, for example, 45° or less in a <011> direction from a {111} plane.

An n-type first diamond semiconductor layer 12 including a principal surface having a first plane orientation is formed on the substrate 10. The first plane orientation has an off angle of, for example, 0° to 10° from the {111} plane.

The first diamond semiconductor layer 12 has a dopant concentration of, for example, $1\times10^{18}$ atoms/cm$^3$ to $1\times10^{21}$ atoms/cm$^3$. The n-type dopant is, for example, phosphorus (P).

Then, a trench structure 14 is formed in the first diamond semiconductor layer 12. The trench structure 14 has, for example, a V-shaped section. Then, the trench structure 14 is provided in such a manner that a second plane orientation (for example, {100} plane or {110} plane) different from the first plane orientation is formed on the inner surface of the trench.

Then, a second diamond semiconductor layer 16 is formed on the first diamond semiconductor layer 12 in the trench structure 14. The second diamond semiconductor layer 16 is a so-called drift layer.

The second diamond semiconductor layer 16 has a lower dopant concentration than the first diamond semiconductor layer 12. The second diamond semiconductor layer 16 is, for example, an n-type, a p-type, or an intrinsic (i) type. From the viewpoint of the realization of a high breakdown voltage, it may be preferable that the second diamond semiconductor layer 16 has a dopant concentration of $1\times10^{15}$ atoms/cm$^3$ or less.

In addition, a first electrode 20 is electrically connected to the first diamond semiconductor layer 12. The first electrode 20 is a cathode (negative electrode).

The first electrode 20 is formed in a trench provided in the first diamond semiconductor layer 12. This structure increases a contact area with the first diamond semiconductor layer 12 and reduces a contact resistance.

The first electrode 20 is formed of a metal. The metal is, for example, titanium (Ti). It may be preferable that the contact between the first electrode 20 and the first diamond semiconductor layer 12 is an ohmic contact.

Also, a second electrode 22 is electrically connected to the second diamond semiconductor layer 16. The second electrode 22 is an anode (positive electrode).

The second electrode 22 is formed of a metal. The metal is, for example, nickel (Ni). The junction between the second electrode 22 and the second diamond semiconductor layer 16 is a Schottky junction. The metal of the second electrode 22 is not limited to nickel as long as it forms a Schottky junction with the second diamond semiconductor layer 16. Examples of the metal may include aluminum (Al), aurum (Au), platinum (Pt), ruthenium (Ru), Titanium (Ti), and tungsten (W).

An insulating film 24 is formed on the surfaces of the first diamond semiconductor layer 12 and the second diamond semiconductor layer 16. Portions of the first electrode 20 and the second electrode 22 are formed on the insulating film 24.

According to the configuration of the semiconductor device 200 of the second embodiment, by having the plane orientation near the {111} plane, the first diamond semiconductor layer 12 can easily contain an n-type dopant of phosphorus at a high concentration. The first diamond semiconductor layer 12 acts as a contact layer with the first electrode 20, and requires a high dopant concentration in order to reduce a contact resistance and an on resistance.

Then, the second diamond semiconductor layer 16 acting as a drift layer requires a low dopant concentration in order to provide a thin film with a high breakdown voltage. According to the configuration of the semiconductor device 100 of the second embodiment, by providing the trench structure in the first diamond semiconductor layer 12 having a high dopant concentration and an underlying plane having a different plane orientation from the {111} plane, such as the {100} plane and the {110} plane, the second diamond semiconductor layer 16 can be grown.

Therefore, the dopant incorporation from the first diamond semiconductor layer 12 can be suppressed, and the dopant concentration can be stably controlled to a low concentration. Accordingly, a Schottky diode having a low on resistance of, for example, 0.1 mΩcm$^2$ or less and a high breakdown voltage of, for example, 1 kV or more can be stably manufactured with high reproducibility.

Also, by suppressing the dopant incorporation, the degradation of the steepness of a junction interface and the occurrence of a defect can be suppressed. Accordingly, the degradation of carrier mobility and the increase of a reverse leakage current can be suppressed.

Next, a method for manufacturing a semiconductor device according to the second embodiment will be described. The method for manufacturing a semiconductor device according to the second embodiment includes: preparing a substrate including a principal surface having a first plane orientation; forming a first diamond semiconductor layer of a first conductivity type including a principal surface having the first plane orientation on the substrate; forming a trench structure in the first diamond semiconductor layer; forming a second diamond semiconductor layer having a lower dopant concentration than the first diamond semiconductor layer on the first diamond semiconductor layer in the trench structure; forming a first electrode electrically connected to the first diamond semiconductor layer; and forming a second electrode electrically connected to the second diamond semiconductor layer.

FIGS. 4A to 4G are schematic cross-sectional views illustrating a method for manufacturing a semiconductor device according to the second embodiment.

Figure 4A:
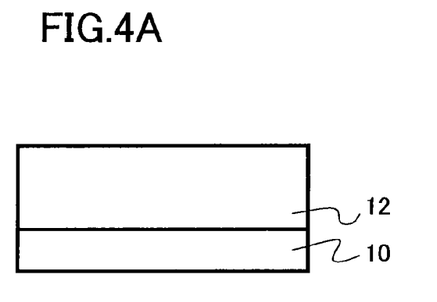
FIGS. 4A to 4G are schematic cross-sectional views illustrating a method for manufacturing a semiconductor device according to the second embodiment.

First, a substrate 10 including a principal surface having a first plane orientation is prepared. The substrate 10 is, for example, an undoped diamond semiconductor. The first plane orientation is, for example, {111}.

Then, an n-type first diamond semiconductor layer 12 including a principal surface having the {111} plane orientation is formed on the substrate 10 (FIG. 4A). A dopant of phosphorus (P) is included in the first diamond semiconductor layer 12. The first diamond semiconductor layer 12 has a dopant concentration of, for example, $1\times10^{18}$ atoms/cm$^3$ to $1\times10^{21}$ atoms/cm$^3$. The first diamond semiconductor layer 12 is formed, for example, by microwave plasma CVD.

Also, from the viewpoint of the incorporation of the dopant in the first diamond semiconductor layer 12 at a high concentration, it may be preferable that the first plane orientation has a slope of 45° or less in the <011> direction from the {111} plane.

Figure 4B:
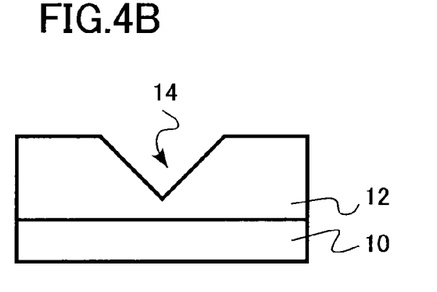

Next, a trench structure 14 is formed in the first diamond semiconductor layer 12, for example, by lithography and RIE (Reactive Ion Etching) (FIG. 4B). The trench structure 14 has, for example, a V-shaped section. The inner surface of the V-shaped trench structure 14 has a second plane orientation different from the first plane orientation. The second plane orientation is, for example, {110}.

Figure 4C:
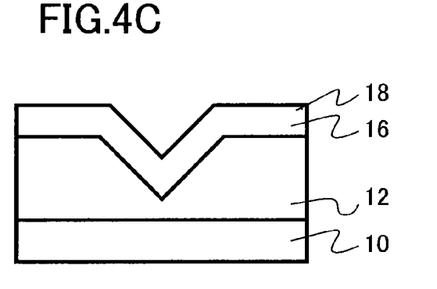

Next, a second diamond semiconductor layer 16 having a lower dopant concentration than the first diamond semiconductor layer 12 is formed on the first diamond semiconductor layer 12 in the trench structure 14 (FIG. 4C). The second diamond semiconductor layer 16 is, for example, an undoped diamond semiconductor layer into which a dopant is not actively incorporated. The second diamond semiconductor layer 16 having the second plane orientation (for example, the {110} plane orientation) exposed to the inner surface is formed in the trench structure 14. The second diamond semiconductor layer 16 is grown and formed in the <110> direction. The second diamond semiconductor layer 16 is formed, for example, by microwave plasma CVD.

Phosphorus (P) incorporation efficiency is smaller in the case of growth in the {110} plane orientation in the <110> direction, than in the case of growth in the {111} plane orientation in the <111> direction. Therefore, in the formation of the second diamond semiconductor layer 16, autodoping of phosphorus from the first diamond semiconductor layer 12 containing a high concentration of underlying phosphorus is suppressed. Therefore, the second diamond semiconductor layer 16 that is very similar to an intrinsic semiconductor can be formed.

Also, while the case that the second plane orientation is {110} has been described as an example herein, the second plane orientation is not limited thereto as long as it is different from the first plane orientation. From the viewpoint of the suppression of the auto-doping of a dopant into the second diamond semiconductor layer 16, it may be preferable that the second plane orientation is within ±10° from the {100} plane or the {110} plane.

Next, a passivation film (not illustrated) is formed in a region including a slope in the trench structure 14 on the second diamond semiconductor layer 16. The passivation film is, for example, a silicon oxide film.

Figure 4D:
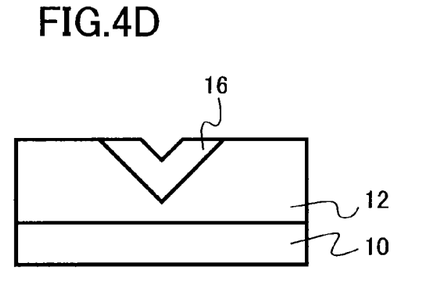

Thereafter, for example, by oxygen-based RIE, the second diamond semiconductor layer 16 is etched until the first diamond semiconductor layer 12 is exposed to the surface. Thereafter, the passivation film is removed by wet etching or the like (FIG. 4D).

Figure 4E:
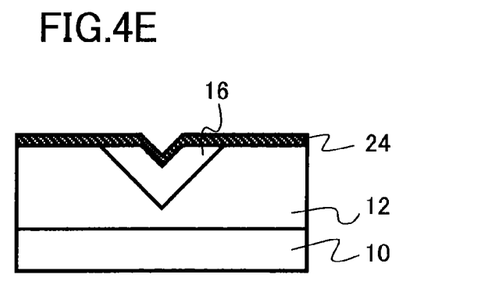

Next, an insulating film 24 is formed in a region including a slope in the trench structure 14 on the third diamond semiconductor layer 18 (FIG. 4E). The insulating film 24 is, for example, a silicon nitride film.

Figure 4F:
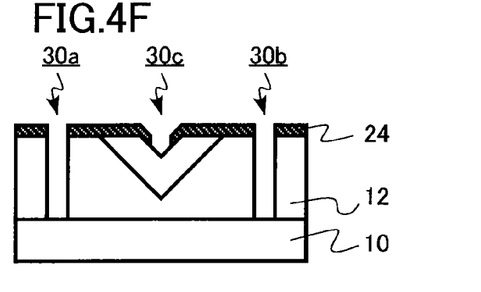

Next, openings 30a and 30b are formed in the insulating film 24, for example, by lithography and RIE. Then, for example, a trench reaching the substrate 10 is formed in the openings 30a and 30b, for example, by RIE. Also, an opening 30c is formed in the insulating film 24, for example, by lithography and RIE (FIG. 4F).

Figure 4G:
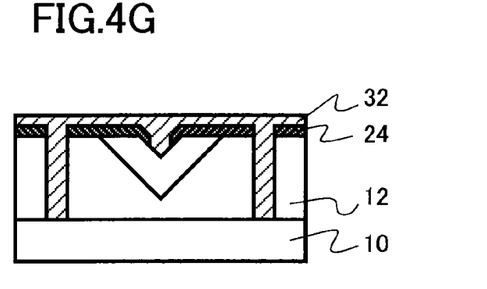

Thereafter, a metal film 32, for example, a titanium (Ti) film is formed by sputtering (FIG. 4G).

Thereafter, for example, by lithography and RIE, the metal film 32 is patterned to form a first electrode 20 and a second electrode 22. By the above manufacturing method, the semiconductor device 200 illustrated in FIG. 3 is formed.

Also, the first electrode 20 and the second electrode 22 may be formed of different metal materials.

Third Embodiment

A semiconductor device according to the third embodiment includes: a substrate; a first diamond semiconductor layer of a first conductivity type formed on the substrate and including a principal surface having a first plane orientation; a trench structure formed in the first diamond semiconductor layer and including an innermost portion reaching the substrate to separate the first diamond semiconductor layer into a first region and a second region; a second diamond semiconductor layer formed on the first diamond semiconductor layer in the trench structure and having a lower dopant concentration than the first diamond semiconductor layer; a source electrode electrically connected to the first region; a drain electrode electrically connected to the second region; and a gate electrode formed on the second diamond semiconductor layer.

The semiconductor device of the third embodiment is different from the semiconductor devices of the first and second embodiments in that the semiconductor device of the third embodiment is not a diode but a field-effect transistor. A description of an overlap with the first or second embodiment will be omitted.

Figure 5:
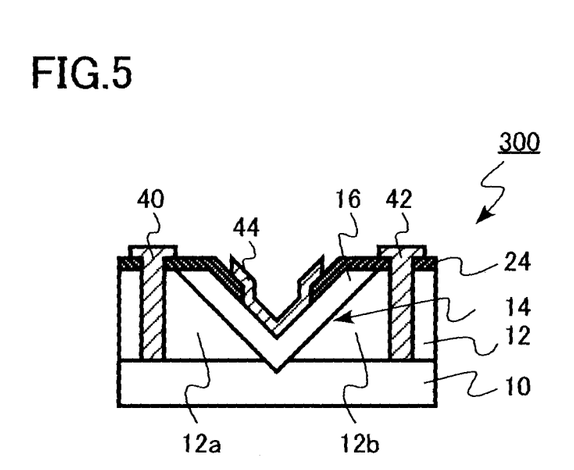
FIG. 5 is a schematic cross-sectional view of a semiconductor device according to the third embodiment.

FIG. 5 is a schematic cross-sectional view of a semiconductor device according to the third embodiment. A semiconductor device 300 according to the third embodiment is a trench field-effect transistor.

The semiconductor device 300 is formed, for example, on a single crystal diamond substrate 10 including a principal surface having a first plane orientation. The first plane orientation has a slope of, for example, 45° or less in a <011> direction from a {111} plane.

An n-type first diamond semiconductor layer 12 including a principal surface having a first plane orientation is formed on the substrate 10. The first plane orientation has an off angle of, for example, 0° to 10° from the {111} plane.

The first diamond semiconductor layer 12 has a dopant concentration of, for example, $1\times10^{18}$ atoms/cm$^3$ to $1\times10^{21}$ atoms/cm$^3$. The n-type dopant is, for example, phosphorus (P).

Then, a trench structure 14 is formed in the first diamond semiconductor layer 12. The trench structure 14 has, for example, a V-shaped section. By the trench structure 14, the first diamond semiconductor layer 12 is separated into a source region (first region) 12a and a drain region (second region) 12b. Then, the trench structure 14 is provided in such a manner that a second plane orientation (for example, {100} plane or {110} plane) different from the first plane orientation is formed on the inner surface of the trench.

Then, a second diamond semiconductor layer 16 is formed on the first diamond semiconductor layer 12 in the trench structure 14. The second diamond semiconductor layer 16 is a so-called channel layer that conducts a carrier.

The second diamond semiconductor layer 16 has a lower dopant concentration than the first diamond semiconductor layer 12. The second diamond semiconductor layer 16 is, for example, an n-type, a p-type, or an intrinsic (i) type. From the viewpoint of the setting of an appropriate threshold value, it may be preferable that the second diamond semiconductor layer 16 has a dopant concentration of $1 \times 10^{15}$ atoms/cm$^3$ or less.

In addition, a source electrode 40 is electrically connected to the first region 12a of the first diamond semiconductor layer 12. The source electrode 40 is formed, for example, in a trench provided in the first region 12a of the first diamond semiconductor layer 12. This structure increases a contact area with the first diamond semiconductor layer 12 and reduces a contact resistance.

The source electrode 40 is formed of a metal. The metal is, for example, titanium (Ti). It may be preferable that the contact between the source electrode 40 and the first diamond semiconductor layer 12 is an ohmic contact.

Also, a drain electrode 42 is electrically connected to the second region 12b of the first diamond semiconductor layer 12. The drain electrode 42 is formed, for example, in a trench provided in the second region 12b of the first diamond semiconductor layer 12. This structure increases a contact area with the first diamond semiconductor layer 12 and reduces a contact resistance.

The drain electrode 42 is formed of a metal. The metal is, for example, titanium (Ti). It may be preferable that the contact between the drain electrode 42 and the first diamond semiconductor layer 12 is an ohmic contact.

Also, a gate electrode 44 is electrically connected to the second diamond semiconductor layer 16. The gate electrode 44 is formed of a metal. The metal is, for example, nickel (Ni). The junction between the gate electrode 44 and the second diamond semiconductor layer 16 is an Schottky junction. The metal of the gate electrode 44 is not limited to nickel as long as it forms a Schottky junction with the second diamond semiconductor layer 16. Examples of the metal may include aluminum (Al), gold (Au), platinum (Pt), ruthenium (Ru), titanium (Ti), and tungsten (W).

An insulating film 24 is formed on the surfaces of the first diamond semiconductor layer 12 and the second diamond semiconductor layer 16. Portions of the source electrode 40, the drain electrode 42 and the gate electrode 44 are formed on the insulating film 24.

According to the configuration of the semiconductor device 300 of the third embodiment, by having the plane orientation near the {111} plane, the first diamond semiconductor layer 12 can easily contain an n-type dopant of phosphorus at a high concentration. The first diamond semiconductor layer 12 acts as a contact layer with the source electrode 40 and the drain electrode 42, and requires a high dopant concentration in order to reduce a contact resistance and an on resistance.

Then, the second diamond semiconductor layer 16 acting as a channel layer requires a low dopant concentration in order to provide a thin film with a high breakdown voltage. According to the configuration of the semiconductor device 100 of the third embodiment, by providing the trench structure in the first diamond semiconductor layer 12 having a high dopant concentration and an underlying plane having a different plane orientation from the {111} plane, such as the {100} plane and the {110} plane, the second diamond semiconductor layer 16 can be grown. Accordingly, the dopant incorporation from the first diamond semiconductor layer 12 can be suppressed, and the dopant concentration can be stably controlled to a low concentration. Accordingly, a field-effect transistor having a low on resistance and a high breakdown voltage can be stably manufactured with high reproducibility.

Also, by suppressing the dopant incorporation, the degradation of the steepness of a junction interface and the occurrence of a defect can be suppressed. Accordingly, the degradation of carrier mobility and the increase of a leakage current can be suppressed.

Also, a gate insulating film may be provided between the second diamond semiconductor layer 16 and the gate electrode 44, and a MISFET (Metal Insulator Semiconductor Field Effect Transistor) structure may be employed.

Next, a method for manufacturing a semiconductor device according to the third embodiment will be described. The method for manufacturing a semiconductor device according to the third embodiment includes: preparing a substrate including a principal surface having a first plane orientation; forming a first diamond semiconductor layer of a first conductivity type including a principal surface having the first plane orientation on the substrate; forming a trench structure having an innermost portion reaching the substrate in the first diamond semiconductor layer; forming a second diamond semiconductor layer having a lower dopant concentration than the first diamond semiconductor layer on the first diamond semiconductor layer in the trench structure; forming a source electrode and a drain electrode electrically connected to the first diamond semiconductor layer; and forming a gate electrode electrically connected to the second diamond semiconductor layer.

FIGS. 6A to 6G are schematic cross-sectional views illustrating a method for manufacturing a semiconductor device according to the third embodiment.

Figure 6A:
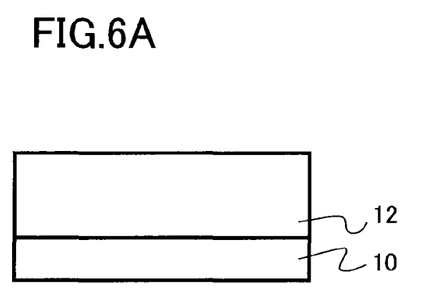
FIGS. 6A to 6G are schematic cross-sectional views illustrating a method for manufacturing a semiconductor device according to the third embodiment.

First, a substrate 10 including a principal surface having a first plane orientation is prepared. The substrate 10 is formed of, for example, an undoped diamond semiconductor. The first plane orientation is, for example, {111}.

Then, an n-type first diamond semiconductor layer 12 including a principal surface having the {111} plane orientation is formed on the substrate 10 (FIG. 6A). A dopant of phosphorus (P) is included in the first diamond semiconductor layer 12. The first diamond semiconductor layer 12 has a dopant concentration of, for example, $1 \times 10^{18}$ atoms/cm$^3$ to $1 \times 10^{21}$ atoms/cm$^3$. The first diamond semiconductor layer 12 is formed, for example, by microwave plasma CVD.

Also, from the viewpoint of the containment of the dopant in the first diamond semiconductor layer 12 at a high concentration, it may be preferable that the first plane orientation has a slope of 45° or less in the <011> direction from the {111} plane.

Figure 6B:
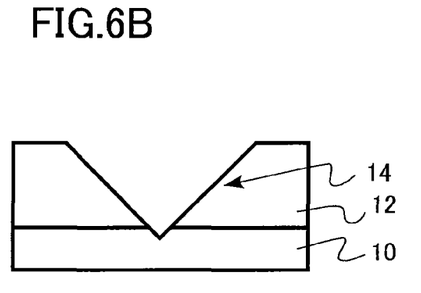

Next, a trench structure 14 having an innermost portion reaching the substrate 10 is formed in the first diamond semiconductor layer 12, for example, by lithography and RIE (Reactive Ion Etching) (FIG. 6B). The trench structure 14 has, for example, a V shape. The inner surface of the V-shaped trench structure 14 has a second plane orientation different from the first plane orientation. The second plane orientation is, for example, {110}.

Figure 6C:
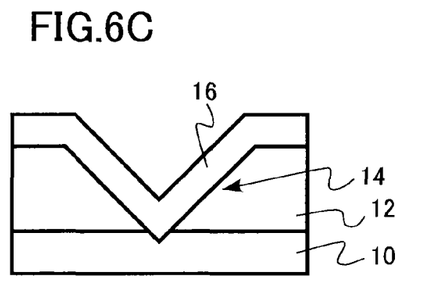

Next, a second diamond semiconductor layer 16 having a lower dopant concentration than the first diamond semiconductor layer 12 is formed on the first diamond semiconductor layer 12 in the trench structure 14 (FIG. 6C). The second diamond semiconductor layer 16 is, for example, an undoped intrinsic diamond semiconductor layer into which a dopant is not actively incorporated. The second diamond semiconductor layer 16 having the second plane orientation (for example, the {110} plane orientation) exposed to the inner surface is formed in the trench structure 14. That is, the second diamond semiconductor layer 16 is grown and formed in the <110> direction. The second diamond semiconductor layer 16 is formed, for example, by microwave plasma CVD.

Phosphorus (P) incorporation efficiency is smaller in the case of growth in the {110} plane orientation in the <110> direction, than in the case of growth in the {111} plane orientation in the <111> direction. Thus, in the formation of the second diamond semiconductor layer 16, auto-doping from the first diamond semiconductor layer 12 containing a high concentration of underlying phosphorus is suppressed. Therefore, the second diamond semiconductor layer 16 that is very similar to an intrinsic semiconductor can be formed.

Also, while the case of the second plane orientation being {110} has been described as an example herein, the second plane orientation is not limited thereto. For example, from the viewpoint of the suppression of the auto-doping of a dopant into the second diamond semiconductor layer 16, it may be preferable that the second plane orientation is within ±10° from the {100} plane or the {110} plane.

Next, a passivation film (not illustrated) is formed in a region including a slope in the trench structure 14 on the second diamond semiconductor layer 16. The passivation film is, for example, a silicon oxide film.

Figure 6D:
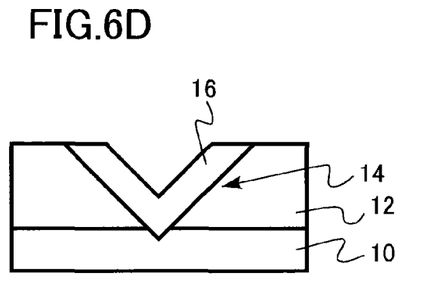

Thereafter, for example, by oxygen-based RIE, the second diamond semiconductor layer 16 is etched until the first diamond semiconductor layer 12 is exposed to the surface. Thereafter, the passivation film is removed by wet etching or the like (FIG. 6D).

Figure 6E:
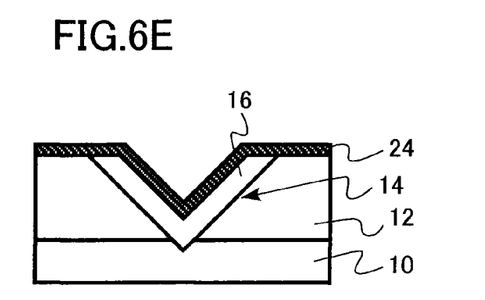

Next, an insulating film 24 is formed in a region including a slope in the trench structure 14 on the third diamond semiconductor layer 18 (FIG. 6E). The insulating film 24 is, for example, a silicon nitride film.

Figure 6F:
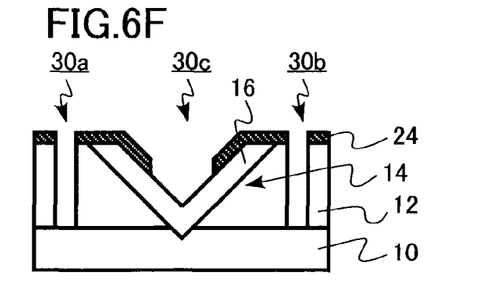

Next, openings 30a and 30b are formed in the insulating film 24, for example, by lithography and RIE. Then, for example, a trench reaching the substrate 10 is formed in the openings 30a and 30b, for example, by RIE. Also, an opening 30c is formed in the insulating film 24, for example, by lithography and RIE (FIG. 6F).

Figure 6G:
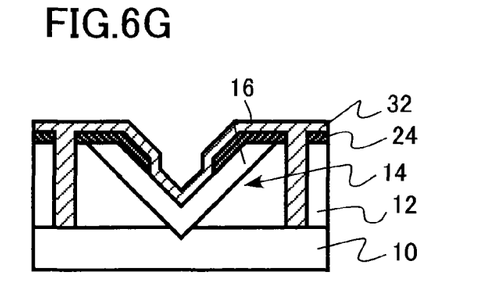

Thereafter, a metal film 32, for example, a titanium (Ti) film is formed by sputtering (FIG. 6G).

Thereafter, for example, by lithography and RIE, the metal film 32 is patterned to form a source electrode 40, a drain electrode 42, and a gate electrode 44. By the above manufacturing method, the semiconductor device 300 illustrated in FIG. 5 is formed.

Also, the source electrode 40, the drain electrode 42, and the gate electrode 44 may be formed of different metal materials.

Fourth Embodiment

A semiconductor device according to the fourth embodiment includes: a first diamond semiconductor layer of a first conductivity type including a principal surface having a first plane orientation; a second diamond semiconductor layer formed on the first diamond semiconductor layer and having a lower dopant concentration than the first diamond semiconductor layer; a trench structure formed in the second diamond semiconductor layer; a third diamond semiconductor layer formed on the second diamond semiconductor layer in the trench structure and having a higher dopant concentration than the second diamond semiconductor layer; a first electrode electrically connected to the first diamond semiconductor layer; and a second electrode electrically connected to the third diamond semiconductor layer.

The semiconductor device of the fourth embodiment is different from the semiconductor devices of the first and second embodiments in that a first diamond semiconductor layer is a high concentration of p-type, in that a trench structure is formed in a second diamond semiconductor layer, and in that the semiconductor device of the fourth embodiment is a vertically device structure having an electrode on the rear surface of the semiconductor device. A description of an overlap with the first or second embodiment will be omitted.

Figure 7:
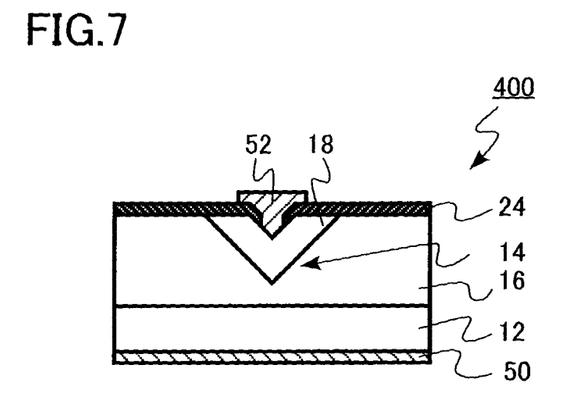
FIG. 7 is a schematic cross-sectional view of a semiconductor device according to the fourth embodiment.

FIG. 7 is a schematic cross-sectional view of a semiconductor device according to the fourth embodiment. A semiconductor device 400 according to the fourth embodiment is a vertical trench PIN diode.

The semiconductor device 400 includes, for example, a p-type first diamond semiconductor layer 12 including a principal surface having a first plane orientation. The first plane orientation is, for example, {100}. Also, as compared with an n-type diamond semiconductor, a p-type diamond semiconductor can easily form a high concentration of semiconductor layer even by growth in the {100} and {110} plane orientations.

The first diamond semiconductor layer 12 has a dopant concentration of, for example, $1 \times 10^{18}$ atoms/cm$^3$ to $1 \times 10^{21}$ atoms/cm$^3$. The p-type dopant is, for example, boron (B).

A second diamond semiconductor layer 16 is formed on the first diamond semiconductor layer 12. The second diamond semiconductor layer 16 is a so-called drift layer.

The second diamond semiconductor layer 16 has a lower dopant concentration than the first diamond semiconductor layer 12. The second diamond semiconductor layer 16 is, for example, a p-type, or an intrinsic (i) type. From the viewpoint of the realization of a high breakdown voltage, it may be preferable that the second diamond semiconductor layer 16 has a dopant concentration of $1 \times 10^{15}$ atoms/cm$^3$ or less.

Then, a trench structure 14 is formed in the second diamond semiconductor layer 16. The trench structure 14 has, for example, a V-shaped section. Then, the trench structure 14 is provided in such a manner that a second plane orientation (for example, {111} plane) different from the first plane orientation is formed on the inner surface of the trench.

Then, an n-type third diamond semiconductor layer 18 is formed on the second diamond semiconductor layer 16 in the trench structure 14. The third diamond semiconductor layer 18 has a higher dopant concentration than the second diamond semiconductor layer 16.

The third diamond semiconductor layer 18 has a dopant concentration of, for example, $1 \times 10^{18}$ atoms/cm$^3$ to $1 \times 10^{21}$ atoms/cm$^3$. The n-type dopant is, for example, phosphorus (P).

In addition, a first electrode 50 is electrically connected to the first diamond semiconductor layer 12 on the rear side of the semiconductor device 400. The first electrode 50 is an anode (positive electrode).

The first electrode 50 is formed of a metal. The metal is, for example, titanium (Ti). It may be preferable that the contact between the first electrode 50 and the first diamond semiconductor layer 12 is an ohmic contact.

Also, a second electrode 52 is electrically connected to the third diamond semiconductor layer 18. The second electrode 52 is a cathode (negative electrode).

The second electrode 52 is formed of a metal. The metal is, for example, titanium (Ti). It may be preferable that the contact between the second electrode 52 and the third diamond semiconductor layer 18 is an ohmic contact.

An insulating film 24 is formed on the surfaces of the second diamond semiconductor layer 16 and the third diamond semiconductor layer 18. A portion of the second electrode 52 is formed on the insulating film 24.

In the fourth embodiment, the second diamond semiconductor layer 16 of a low dopant concentration is formed by growth in the {100} plane orientation that has relatively low boron incorporation efficiency. Accordingly, the increase or instability of a dopant concentration by the auto-doping from the first diamond semiconductor layer 12 of a high dopant concentration can be suppressed.

Then, an n-type third diamond semiconductor layer 18 of a high dopant concentration is formed on the second diamond semiconductor layer 16 of a low dopant concentration having the {100} plane. In this case, the third diamond semiconductor layer 18 is formed in the trench structure 14 formed in the second diamond semiconductor layer 16. The trench structure 14 is provided in such a manner that a second plane (for example, {111}) having a different plane orientation from the {100} plane is formed on the inner surface of the trench.

Therefore, the third diamond semiconductor layer 18 can be formed by growth in the {111} plane orientation that has high phosphorus incorporation efficiency, and a high dopant concentration of n-type semiconductor layer can be stably formed. From the viewpoint of the increase of phosphorus incorporation efficiency, it may be preferable that the plane orientation of the interface between the second diamond semiconductor layer 16 and the third diamond semiconductor layer 18 has a slope of 45° or less in the <011> direction from the {111} plane.

Since the semiconductor device according to the fourth embodiment has the above configuration, the dopant of an intrinsic semiconductor layer or the second diamond semiconductor layer having a low dopant concentration is controlled with high accuracy. Also, the third diamond semiconductor layer of a high concentration can be stably formed. Therefore, a stable, low-on-resistance and high-breakdown-voltage semiconductor device can be realized.

Next, a method for manufacturing a semiconductor device according to the fourth embodiment will be described. The method for manufacturing a semiconductor device according to the fourth embodiment includes: preparing a first diamond semiconductor layer of a first conductivity type including a principal surface having a first plane orientation; forming a second diamond semiconductor layer having a lower dopant concentration than the first diamond semiconductor layer on the first diamond semiconductor layer including the principal surface having the first plane orientation; forming a trench structure in the second diamond semiconductor layer; forming a third diamond semiconductor layer of a second conductivity type having a higher dopant concentration than the second diamond semiconductor layer on the second diamond semiconductor layer in the trench structure; forming a first electrode electrically connected to the first diamond semiconductor layer; and forming a second electrode electrically connected to the third diamond semiconductor layer.

FIGS. 8A to 8H are schematic cross-sectional views illustrating a method for manufacturing a semiconductor device according to the fourth embodiment.

Figure 8A:
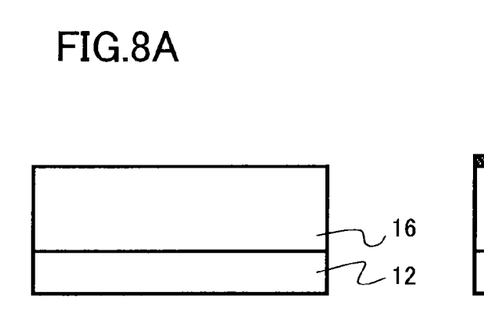
FIGS. 8A to 8H are schematic cross-sectional views illustrating a method for manufacturing a semiconductor device according to the fourth embodiment.

First, a p-type first diamond semiconductor layer (substrate) 12 including a principal surface having a first plane orientation is prepared. A dopant of boron (B) is included in the first diamond semiconductor layer 12. The first diamond semiconductor layer 12 has a dopant concentration of, for example, $1 \times 10^{18}$ atoms/cm$^3$ to $1 \times 10^{21}$ atoms/cm$^3$. The first plane orientation is, for example, {100}.

Then, a second diamond semiconductor layer 16 having a lower dopant concentration than the first diamond semiconductor layer 12 having a principal surface of {100} is formed on the first diamond semiconductor layer 12 (FIG. 8A). The second diamond semiconductor layer 16 is, for example, an undoped diamond semiconductor layer into which a dopant is not actively incorporated. The second diamond semiconductor layer 16 is formed, for example, by microwave plasma CVD.

Boron (B) incorporation efficiency is smaller in the case of growth in the {100} plane orientation than in the case of growth in the {111} plane orientation. Therefore, in the formation of the second diamond semiconductor layer 16, auto-doping from the first diamond semiconductor layer 12 containing a high concentration of underlying boron is suppressed. Therefore, the second diamond semiconductor layer 16 that is very similar to an intrinsic semiconductor can be formed.

Figure 8B:
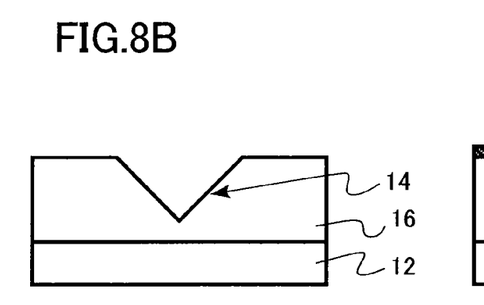

Next, a trench structure 14 is formed in the second diamond semiconductor layer 16, for example, by lithography and RIE (Reactive Ion Etching) (FIG. 8B). The trench structure 14 has, for example, a V-shaped section. The inner surface of the V-shaped trench structure 14 has a second plane orientation different from the first plane orientation. The second plane orientation is, for example, {111}.

Figure 8C:
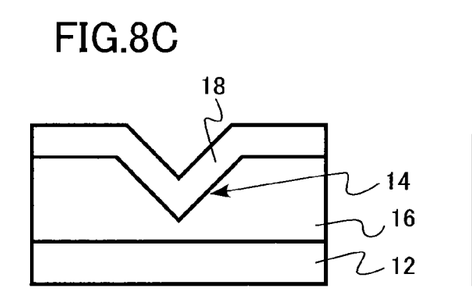

Next, a third diamond semiconductor layer 18 having a higher dopant concentration than the second diamond semiconductor layer 16 is formed on the second diamond semiconductor layer 16 in the trench structure 14 (FIG. 8C). The third diamond semiconductor layer 18 having the second plane orientation (for example, the {111} plane orientation) exposed to the inner surface is formed in the trench structure 14.

A dopant of phosphorus (P) is included in the third diamond semiconductor layer 18. The third diamond semiconductor layer 18 has a dopant concentration of, for example, $1 \times 10^{18}$ atoms/cm$^3$ to $1 \times 10^{21}$ atoms/cm$^3$. The third diamond semiconductor layer 18 is formed, for example, by microwave plasma CVD.

Phosphorus (P) incorporation efficiency is greater in the case of growth in the {111} plane orientation in the <111> direction, than in the case of growth in the {100} plane orientation in the <100> direction. Therefore, in the formation of the third diamond semiconductor layer 18, a high concentration of semiconductor layer can be stably formed.

Also, while the case of the first plane orientation being {100} has been described as an example herein, the first plane orientation is not limited thereto. For example, from the viewpoint of the suppression of the auto-doping of a dopant into the second diamond semiconductor layer 16, it may be preferable that the first plane orientation is within ±10° from the {100} plane or the {110} plane.

Also, while the case of the second plane orientation being {111} has been described as an example herein, the second plane orientation is not limited thereto. For example, from the viewpoint of the increase of the dopant concentration of the third diamond semiconductor layer 18, it may be preferable that the second plane orientation has a slope of ±45° or less in the <011> direction from the {111} plane.

Next, a passivation film (not illustrated) is formed in a region including a slope in the trench structure 14 on the third diamond semiconductor layer 18. The passivation film is, for example, a silicon oxide film.

Figure 8D:
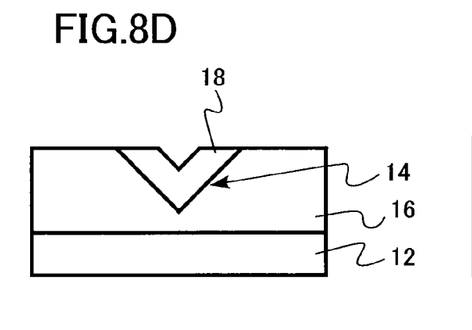

Thereafter, for example, by oxygen-based RIE, the third diamond semiconductor layer 18 is etched until the second diamond semiconductor layer 16 is exposed to the surface. Thereafter, the passivation film is removed by wet etching or the like (FIG. 8D).

Figure 8E:
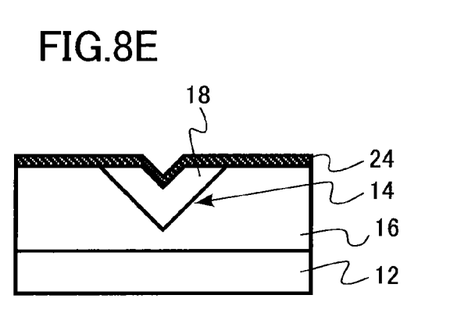

Next, an insulating film 24 is formed in a region including a slope in the trench structure 14 on the third diamond semiconductor layer 18 (FIG. 8E). The insulating film 24 is, for example, a silicon nitride film.

Figure 8F:
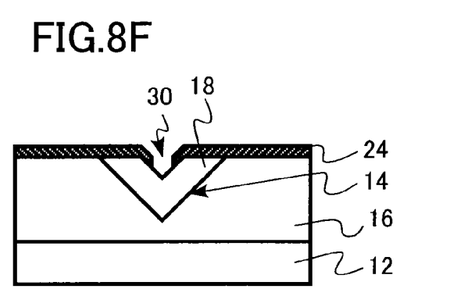

Next, an opening 30 is formed in the insulating film 24, for example, by lithography and RIE (FIG. 8F).

Figure 8G:
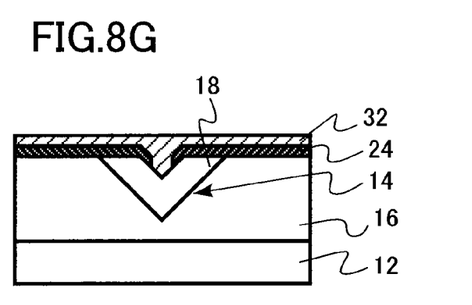

Thereafter, a metal film 32, for example, a titanium (Ti) film is formed by sputtering (FIG. 8G).

Figure 8H:
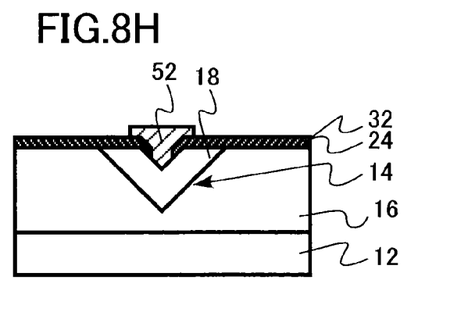

Thereafter, for example, by lithography and RIE, the metal film 32 is patterned to form a second electrode 52 (FIG. 8H). In addition, by sputtering, a metal film (not illustrated), for example, a titanium (Ti) film is formed on the rear surface of the first diamond semiconductor layer 12 to form a first electrode 50 (FIG. 7). By the above manufacturing method, the semiconductor device 400 illustrated in FIG. 7 is formed.

EXAMPLES

Hereinafter, examples will be described.

Example 1

A PIN diode having the structure of the first embodiment was manufactured.

First, by microwave plasma CVD, a phosphorus-doped $n^+$-type diamond layer (first diamond semiconductor layer) 12 was formed on an undoped diamond substrate 10 having a principal surface of $\{111\}$. Then, by lithography and RIE, a V-shaped trench structure 14 was formed in the $n^+$-type diamond layer 12. The planes forming the V shape of the trench structure 14 were formed so that their orientations were $\{110\}$.

By microwave plasma CVD, an undoped diamond layer (second diamond semiconductor layer) 16 and a boron-doped $p^+$-type diamond semiconductor layer (third diamond semiconductor layer) 18 were formed on the $n^+$-type diamond layer 12 in the trench structure 14.

Thereafter, an $SiO_2$ passivation film was formed on a slope inside the V shape by patterning, and the other portions were etched by oxygen-based RIE until the $n^+$-type first diamond layer 12 was exposed to the surface. Then, the $SiO_2$ was removed by an etchant such as ammonium fluoride, and a SiN passivation film (insulating film) 24 was formed on the top surface by patterning.

In addition, a trench was vertically formed in the $n^+$-type diamond layer 12 until the substrate 10 is exposed, and an ohmic electrode (second electrode) 22 and an ohmic electrode (first electrode) 20 were respectively formed on the inner surface of the V shape and in the trench formed in the $n^+$-type diamond layer 12.

As the ohmic electrode, Ti/Pt/Au was deposited by electron beam vapor deposition, and was annealed for 15 minutes at 500° C. The boron concentration of the $p^+$-type diamond layer 18 was $5\times10^{20}$ atoms/cm$^3$, and the phosphorus concentration of the $n^+$-type diamond layer 12 was $1\times10^{20}$ atoms/cm$^3$. The phosphorus and boron concentration in the undoped diamond layer 16 was equal to or less than a lower detection limit of SIMS (Secondary Ion Mass Spectroscopy) $1\times10^{15}$ atoms/cm$^3$).

The I-V characteristics of the manufactured PIN diode were measured. The values of a rectification ratio of 10 or more digits at ±10 V and a forward current density of 10000 A/cm$^2$ at 10 V were obtained. Also, a reverse leakage current was 1 pA or less at 100 V, and a breakdown did not occur even when a voltage of up to 3 kV was applied.

Example 2

A Schottky diode having the structure of the second embodiment was manufactured.

First, a phosphorus-doped $n^+$-type diamond layer (first diamond semiconductor layer) 12 was formed on an undoped diamond substrate 10 having a principal surface of $\{111\}$. Then, by lithography and RIE, a V-shaped trench structure 14 was formed in the $n^+$-type diamond layer 12. The planes forming the V shape of the trench structure 14 were formed so that their orientations were $\{110\}$.

By microwave plasma CVD, an undoped diamond layer (second diamond semiconductor layer) 16 was formed on the $n^+$-type diamond layer 12 in the trench structure 14.

Thereafter, an $SiO_2$ passivation film was formed on a slope inside the V shape by patterning, and the other portions were etched by oxygen-based RIE until the $n^+$-type first diamond layer 12 was exposed to the surface. Then, the $SiO_2$ was removed by an etchant such as ammonium fluoride, and a SiN passivation film (insulating film) 24 was formed on the top surface by patterning.

In addition, a trench was vertically formed in the $n^+$-type diamond layer 12 until the substrate 10 is exposed, and an ohmic electrode (second electrode) 22 and an ohmic electrode (first electrode) 20 were respectively formed on the inner surface of the V shape and in the trench formed in the $n^+$-type diamond layer 12.

As the ohmic electrode, Ti/Pt/Au was deposited by electron beam vapor deposition, and was annealed for 15 minutes at 500° C. The phosphorus concentration of the $n^+$-type diamond layer 12 was $1\times10^{20}$ atoms/cm$^3$. The phosphorus and boron concentration in the undoped diamond layer 16 was equal to or less than a lower detection limit of SIMS (Secondary Ion Mass Spectroscopy) $1\times10^{15}$ atoms/cm$^3$).

The I-V characteristics of the manufactured PIN diode were measured. The values of a rectification ratio of 10 or more digits at ±10 V and a forward current density of 1000 A/cm$^2$ at 10 V were obtained. Also, a reverse leakage current was 1 pA or less at 100 V, and a breakdown did not occur even when a voltage of up to 3 kV was applied.

Example 3

A field-effect transistor having the structure of the third embodiment was manufactured.

First, by microwave plasma CVD, a phosphorus-doped $n^+$-type diamond layer (first diamond semiconductor layer) 12 was formed on an undoped diamond substrate 10 having a principal surface of $\{111\}$. Then, by lithography and RIE, a V-shaped trench structure 14 reaching the substrate 10 was formed in the $n^+$-type diamond layer 12. The planes forming the V shape of the trench structure 14 were formed so that their orientations were $\{110\}$.

By microwave plasma CVD, an undoped diamond layer (second diamond semiconductor layer) 16 was formed on the $n^+$-type diamond layer 12 in the trench structure 14.

Thereafter, an $SiO_2$ passivation film was formed on a slope inside the V shape by patterning, and the other portions were etched by oxygen-based RIE until the $n^+$-type first diamond layer 12 was exposed to the surface. Then, the $SiO_2$ was removed by an etchant such as ammonium fluoride, and a SiN passivation film (insulating film) 24 was formed on the top surface by patterning.

In addition, a source electrode 40 and a drain electrode 42 were formed on the inner surface of the V shape and the n+-type diamond layer 12. In the formation of the source electrode 40 and the drain electrode 42, Ti/Pt/Au was deposited by electron beam evaporation and was annealed for 15 minutes at 500° C. Thereafter, a gate electrode 44 was additionally formed on the undoped diamond layer 16.

The phosphorus concentration of the n⁺-type diamond layer 12 was $1\times10^{20}$ atoms/cm³, and the phosphorus and boron concentration in the undoped diamond layer 16 was equal to or less than a lower detection limit of SIMS (Secondary Ion Mass Spectroscopy) ($\leq 1\times10^{15}$ atoms/cm³).

The manufactured field-effect transistor exhibited normally-off characteristics in which a drain current does not flow when a gate voltage is not applied at a threshold voltage of 4.5 V. A characteristic on resistance at a current density of 1000 A/cm² at a gate voltage of 20 V was 1 mΩcm², and a breakdown voltage in an off state was 3 kV.

In the first to third embodiments, the structure of forming an electrode in the trench reaching the substrate has been described as an example. From the viewpoint of the reduction of a contact resistance, the above embodiments may be preferable. However, for example, a structure in which a trench does not reach the substrate, and a structure in which a trench is not provided may be possible.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first diamond semiconductor layer of a first conductivity type including a principal surface having a first plane orientation;
   a trench structure formed in the first diamond semiconductor layer;
   a second diamond semiconductor layer formed on the first diamond semiconductor layer in the trench structure and having a lower dopant concentration than the first diamond semiconductor layer;
   a first electrode electrically connected to the first diamond semiconductor layer; and
   a second electrode electrically connected to the second diamond semiconductor layer.

2. The device according to claim 1, wherein the first conductivity type is an n-type.

3. The device according to claim 1, wherein the first plane orientation has a slope of 45° or less in a <011> direction from a {111} plane.

4. The device according to claim 3, wherein a plane orientation of an interface between the first diamond semiconductor layer and the second diamond semiconductor layer is within ±10° from a {100} plane or a {110} plane.

5. The device according to claim 1, wherein the second diamond semiconductor layer has a dopant concentration of $1\times10^{15}$ atoms/cm³ or less.

* * * * *